United States Patent

[11] 3,617,818

[72] Inventor Clyde R. Fuller
Plano, Tex.
[21] Appl. No. 788,264
[22] Filed Dec. 31, 1968
[45] Patented Nov. 2, 1971
[73] Assignee Texas Instruments Incorporated
Dallas, Tex.

[54] CORROSION-RESISTENT MULTIMETAL LEAD CONTACT FOR SEMICONDUCTOR DEVICES
8 Claims, 10 Drawing Figs.

[52] U.S. Cl. .......... 317/234 R, 317/234 J;234 M;234 N, 29/195;589;590
[51] Int. Cl. .......... H01l 3/00, H01l 5/00
[50] Field of Search .......... 317/234, 235, 5, 5.2, 5.3, 5.4, 183.5; 29/195, 196, 589, 576, 590; 313/355

[56] References Cited

UNITED STATES PATENTS

| | | | |
|---|---|---|---|
| 3,159,462 | 12/1964 | Kadelburg | 317/234 X |
| 3,237,271 | 3/1966 | Arnold et al. | 317/234 |
| 3,266,127 | 8/1966 | Harding et al. | 317/234 |
| 3,290,570 | 12/1966 | Cunningham et al. | 317/234 |
| 3,409,809 | 11/1968 | Diehl | 317/234 |
| 3,436,615 | 4/1969 | Finlayson | 317/234 |
| 3,381,256 | 4/1968 | Schuller et al. | 317/234 X |
| 3,442,012 | 5/1969 | Murray | 317/234 X |
| 3,462,723 | 8/1969 | Phillips | 29/195 X |

OTHER REFERENCES

IMB Technical Disclosure Bulletin, by Collings et al., Vol. 9 No. 12, May 1967 page 1805 copy in 317/234

*Primary Examiner*—John W. Huckert
*Assistant Examiner*—Andrew J. James
*Attorneys*—James O. Dixon, Andrew M. Hasell, Harold Levine, Melvin Sharp, John E. Vandigriff, Henry T. Olsen and Michael A. Sileo, Jr.

ABSTRACT: A gold-bonding area is exposed by an opening in the upper molybdenum layer of a trimetal molybdenum-gold-molybdenum contact system for a semiconductor device. A layer of chromium, or other suitable corrosion-resistant material, is formed over the edges of the molybdenum layers and extends for a distance over the exposed gold-bonding area in order to seal the edges of the molybdenum layers. An insulation layer is formed over the layer of chromium and selectively removed to define an opening exposing the gold-bonding area. In one embodiment, a second layer of gold is formed over the edges of the chromium layer, with the insulation layer abutting the outer edges of the second gold layer.

INVENTOR
CLYDE R. FULLER

ATTORNEY

CORROSION-RESISTENT MULTIMETAL LEAD CONTACT FOR SEMICONDUCTOR DEVICES

This invention relates to ohmic contacts for semiconductor devices such as discrete transistors and integrated circuits, and more particularly to corrosion-resistant contacts for passivated semiconductor devices.

In an effort to increase the current density capacity of leads for discrete transistors and integrated circuits, multimetal contact systems such as molybdenum-gold and molybdenum-gold-molybdenum have been developed which have current-carrying capabilities far exceeding that of aluminum for example. For example, the molybdenum-gold contact system is described in U.S. Pat. No. 3,290,570 and the molybdenum-gold-molybdenum contact system is described in copending patent application Ser. No. 606,064 entitled "Ohmic Contacts and Multilevel Interconnection System for Integrated Circuits" filed Dec. 30, 1966 by James A. Cunningham and Robert S. Clark and assigned to the assignee of this application.

With the use of such multimetal leads, passivating insulation such as silicon oxide or the like is often applied over the leads to prevent deterioration of the leads through corrosion. While the insulation satisfactorily inhibits deterioration of the leads, the insulation layer must be terminated at bonding areas which are exposed to facilitate the attachment of exterior leads through ball-bonding techniques and the like. Problems have thus heretofore arisen due to deterioration and corrosion of multimetal leads at such bonding areas.

In accordance with the present invention, contact structure for a semiconductor device is formed by a layer of corrosion-resistant material formed over the edges of an opening extending through a layer of a multimetal lead. The layer of corrosion-resistant metal terminates at edges to define an exposed bonding area on the lead within the opening. Insulation is formed over the layer of corrosion-resistant material and extends generally to the edges of the corrosion-resistant material.

In a more specific aspect of the invention, a bonding area is defined on the gold level of a multimetal lead of molybdenum and gold by a hole which is cut through the upper molybdenum level. A layer of corrosion-resistant metal, such as chromium, is formed over the edges of the hole cut through the molybdenum level and extends for a distance over the gold level to seal the edges of the molybdenum level. An insulating layer is then formed over the layer of corrosion-resistant metal and terminates in sidewalls which define the opening to the bonding area.

In accordance with another aspect of the invention, a layer of metal such as gold is formed over the interior edges of the corrosion-resistant metal within an opening to a bonding area and abuts a portion of the sidewalls of the insulation layer.

For a more complete understanding of the present invention and for further objects and advantages thereof, reference is now made to the following description taken in conjunction with the accompanying drawings, in which.

Figure 1:
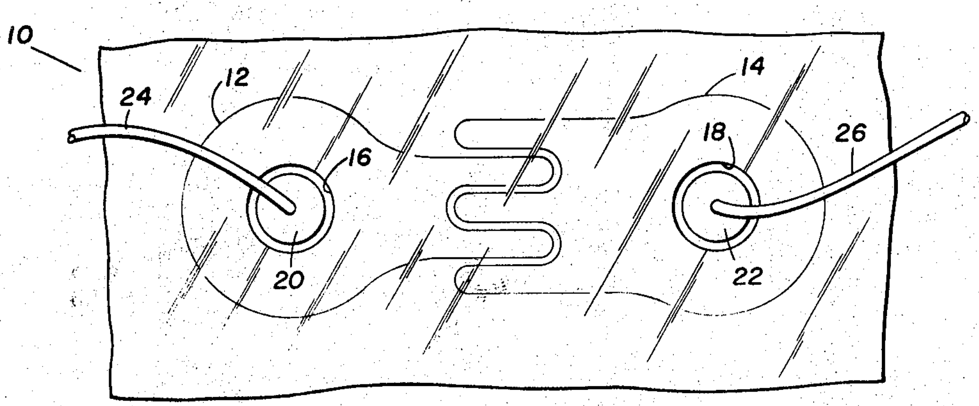
FIG. 1 is a top view of a typical discrete transistor which may be used in an integrated circuit, illustrating the use of ball bonds attached to bonding areas.
Figure 8:
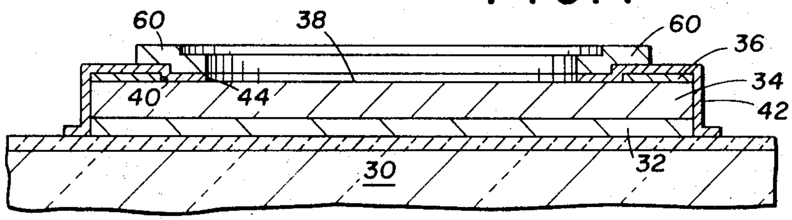
FIG. 8 is a sectional view of the structure shown in FIG. 7 with a portion of the upper layer of metal removed.
Figure 9:
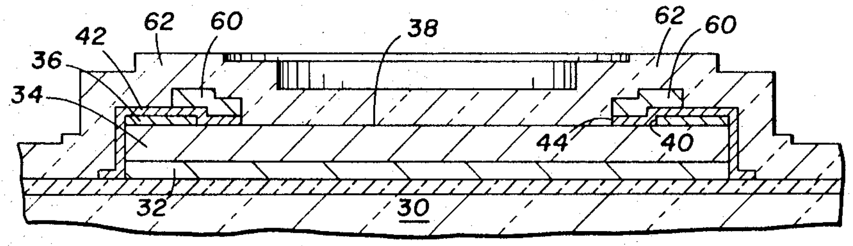
Figure 10:
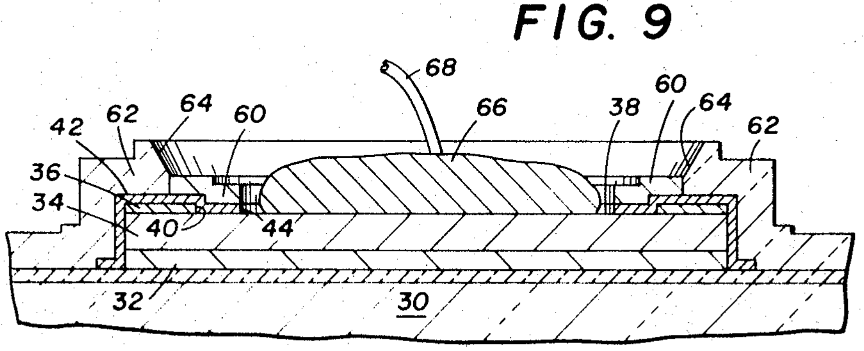

FIG. 9 is a sectional view of the structure shown in FIG. 8 with a layer of insulation applied thereover; and FIG. 10 is a sectional view of the structure shown in FIG. 9 with a portion of the insulation layer removed to define an opening to a bonding area and with a ball bond terminal applied to the exposed bonding area. Referring to FIG. 1, a typical discrete transistor adapted for use in an integrated circuit is illustrated generally by the numeral 10. Throughout the following disclosure, reference will be made to a single multimetal lead for simplicity of description. However, it should be understood that the present multimetal lead invention may be utilized either in a discrete transistor or in single or multilevel integrated circuits. The transistor 10 may comprise any one of a variety of transistors which are formed on slices of semiconductor material and which comprise an active transistor area disposed between terminal bonding areas 12 and !14. In the illustrated embodiment, the surface of the transistor 10 is covered with an insulation layer such as silicon oxide. Contact openings, or via holes, 16 and 18 are cut through the insulation layer to expose a pair of metal-bonding areas. Metal ball bonds 20 and 22 are connected to the exposed bonding areas in the manner well known in the art to provide wires 24 and 26 for connection to another device.

Each ball bond is preferably formed from gold wire which is initially fed through a capillary tube, with the end of the wire heated by a flame to form a ball whose diameter is essentially larger than the diameter of the wire. The gold ball is then manipulated to the point on the transistor at which bonding is desired and the ball is then firmly compressed against the exposed bonding area of the transistor. The ball is thus deformed into a thermal compression bond with the bonding area. As previously discussed, it is important to seal the edges of the via holes 16 and 18 in order to prevent oxidation and other corrosion.

Figure 2:
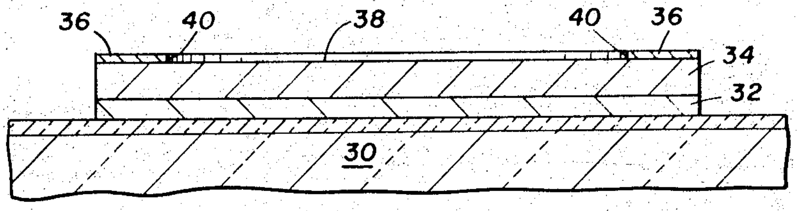
FIG. 2 is a sectional view of a metal lead with an opening cut through the upper level.

FIG. 2 illustrates a cross-sectional view of a multimetal lead for a transistor such as shown in FIG. 1. The metal terminal is formed on an oxide layer overlying a semiconductor slice 30, and in the preferred embodiment comprises a lower layer 32 of molybdenum, a layer 34 of gold and an upper layer 36 of molybdenum. As is known, the multimetal molybdenum-gold-molybdenum leads have superior current density carrying characteristics. The lower level of molybdenum is desirable because it does not alloy with silicon at temperatures ordinarily used in the manufacture and use of integrated circuits. Also, the molybdenum does not alloy with and is not generally penetrated by gold. The molybdenum is desirable for the upper lead layer because it adheres reasonably well to silicon oxide and because it may be selectively applied with evaporation and photoresist masking techniques ordinarily used in integrated circuit manufacture.

Gold is ideal for the exposed bonding area layer 38 because gold is highly conductive, so that substantial series resistance is not introduced. Additionally, gold adheres well to molybdenum and gold may be easily bonded to the commonly used ball-bonding gold wires, without the formation of gold-aluminum reaction which occurs when aluminum is used as a contact metal.

As shown in FIG. 2, a hole is etched into the upper layer 36 of molybdenum to expose a bonding area 38 on the gold layer 34. It is the object of the present invention to seal the edges 40 of the molybdenum layer 36 against corrosion. The hole shown in FIG. 2 is formed by applying a photoresist layer over the upper molybdenum layer 36 by conventional techniques and then patterning the photoresist layer by exposure through a suitable photomask having a preselected fixed pattern. This fixed pattern exposes areas of the photoresist overlying the terminals of the transistor, the photoresist then being developed by spraying with a suitable developing solution. The semiconductor slice is then immersed in a suitable etching solution to etch openings through the molybdenum layer 36 to expose the bonding area 38. The remaining photoresist is then stripped from the body.

Figure 3:
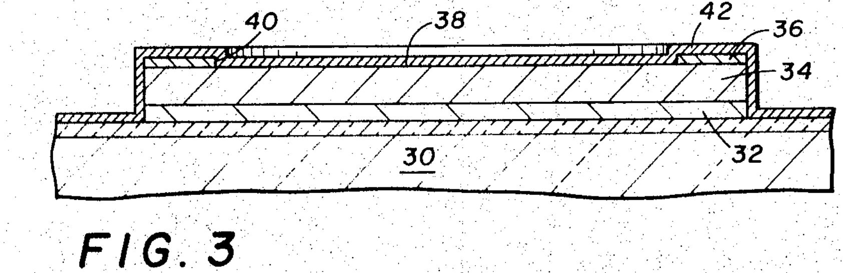
FIG. 3 is a sectional view of the metal lead of FIG. 2 with a level of corrosion-resistant metal added thereto.

FIG. 3 illustrates the application of a layer 42 of a material which has superior corrosion-resistant properties compared to the properties of molybdenum. In the preferred embodiment, the layer 42 comprises a layer of chromium, which is deposited by a suitable conventional technique, such as evaporation or by triode or RF sputtering. Although the invention has been described by etching a hole through an upper molybdenum layer, in some instances the entire upper molybdenum layer may be removed from the general contact area. In such a case, the layer 42 will be deposited only over the exposed gold area.

Figure 4:
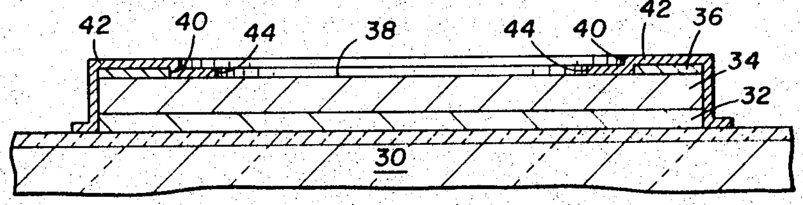
FIG. 4 is a sectional view of the structure shown in FIG. 3 with selected portions of the corrosion-resistant metal layer removed to define a bonding area.

After the deposition of layer 42, photoresist is applied over the layer of chromium 42 and a fixed mask is utilized to expose the photoresist. The photoresist is then etched by a suitable etchant such as hydrochloric acid in the conventional manner. Hydrochloric acid will etch chromium but will not etch molybdenum. The photoresist is then removed and the resulting structure is illustrated in FIG. 4. The bonding area 38 is again exposed, but the edges 40 of the molybdenum layer 36 are sealed by the chromium layer 42. Edge portions 44 of the chromium layer 42 extend for a distance over the gold layer 34 to provide an excellent seal for the molybdenum layer to prevent corrosion thereof.

Figure 5:
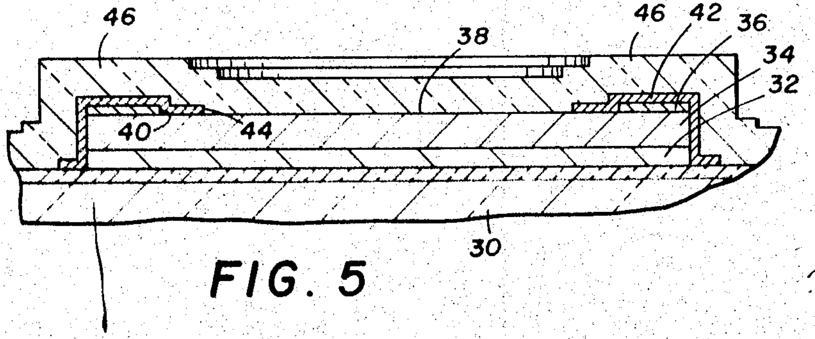
FIG. 5 is a sectional view of the structure shown in FIG. 4 with a layer of insulation formed thereover.

FIG. 5 illustrates the next step of manufacture of the present bonding hold structure, wherein a layer 46 of insulation is deposited over the entire surface of the slice. The layer of insulation 46 may comprise any suitable insulation material, such as silicon oxide, which is grown by a suitable technique such as the conventional silane process.

Figure 6:
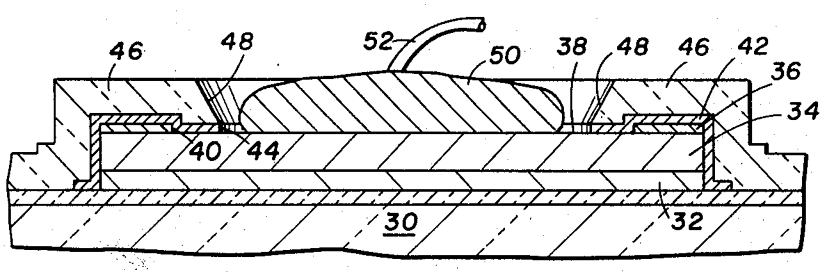
FIG. 6 is a sectional view of the structure shown in FIG. 5 with a portion of the insulation removed and a ball bond terminal attached to the exposed bonding area.

As shown in FIG. 6, in the next step of manufacture, the insulation layer 46 is etched by the use of the conventional photoresist-photomask technique to define sidewalls 48. Sidewalls 48 serve as the walls of the hole to the exposed bonding area 38 on the gold layer 34. Although the sidewalls 48 are illustrated as being an extension from the inner edges of the chromium layer 42, little damage to the via hole structure occurs if the sidewalls 48 are not precisely formed because of lack of exact control of the etching procedure. This is due to the fact that the molybdenum layer is sealed by the chromium layer 42, and further because additional metallization is not required after the etching of the insulation.

As shown in FIG. 6, after the bonding hole has been etched through the insulating layer 46, a gold ball bond 50 may be bonded to the bonding area 38 and a lead 52 is bent for attachment with another device.

From the inspection of the completed contact structure shown in FIG. 6, it will be understood that problems in very accurately controlling the oxide contour of the via hole are avoided, as slight discrepancies in the sidewalls 48 may be tolerated due to the chromium layer 42.

The contact structure of FIG. 6 has been found to provide excellent bonding connections with excellent corrosion protection during extensive electrically biased testing in an environment of 85° C. and 85 percent relative humidity. The technique utilized to construct the contact structure is compatible with present day integrated circuit fabrication techniques.

Although the use of a multimetal molybdenum and gold lead has been disclosed, it will be understood that in some instances multimetal leads of different materials may be utilized. For instance, the present invention may be practiced on a multimetal lead of tungsten and gold as disclosed in copending patent application Ser. No. 715,462 filed Mar. 4, 1968, now abandoned, by Clyde R. Fuller and James A. Cunningham and assigned to the assignee of the present application and now abandoned.

The chromium layer may be etched with an etchant comprising ceric sulfate, sulfuric acid and nitric acid. This etchant is advantageous in that it tends to eliminate passivating of the chromium layer, and further because it will etch gold.

Additionally, different metals may be used in place of the chromium metal layer to act as a seal for a multimetal lead. For instance, aluminum, titanium, zirconium and tantalum may be used. Of course, it other metals are utilized in place of the chromium layer, different etchants will be required. For instance, if a layer of aluminum is utilized, hydrochloric acid may be utilized as the etchant, while if titanium is utilized, hydrofluoric acid may be used as the etchant.

The corrosion-resistant contact structure of the invention may be advantageously utilized with discrete semiconductor devices and with single-level or multilevel interconnection systems of integrated circuits where a connection area or bonding area is to be protected for corrosion resistance.

Figure 7:
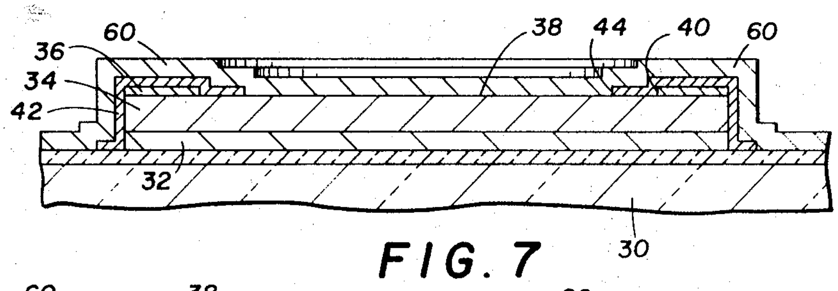
FIG. 7 is a sectional view of the structure shown in FIG. 4 with a second layer of corrosion-resistant metal applied thereover.

In some instances, it has been found that chromium is difficult to etch, thereby making it somewhat difficult to etch a bonding hole with hydrochloric acid. In such instances, the second embodiment of the invention shown in FIGS. 7–10 may be advantageously utilized. FIG. 7 illustrates the multimetal lead structure shown in FIG. 4, with like numbers being utilized for like and corresponding parts, and with the addition of a layer of gold 60 which has been deposited by suitable conventional techniques.

As shown in FIG. 8, with the use of conventional photoresist etching techniques, portions of the gold layer 60 are etched away to expose the bonding area 38 on the gold layer 34 and to expose the outer bounds of the chromium-sealing layer 42.

FIG. 9 illustrates the next step of manufacture which includes the deposition of a layer of insulation 62, which comprises silicon oxide or various layers of different types of suitable passivating insulation.

FIG. 10 illustrates the final step of fabrication, wherein generally sloping sidewalls 64 are etched into the insulation layer 62 to expose the bonding area. A gold ball bond 66 is formed on the bonding area 38 with an outwardly extending lead 68 being presented for connection to another device. As may be seen from an inspection of FIG. 10, the gold layer 60 may also be used to provide ball bond, or other contact, adhesion, and the gold layer thus effectively increases the size of the bonding area of the hole while providing excellent sealing characteristics to the bonding hole structure. The layer of gold 60 also provides additional protection to the chromium layer 42 and the molybdenum layer 36 from the effects of deterioration due to corrosion or the like.

Additional suitable metals may be substituted for the metals illustrated in FIGS. 7–10 in the manner previously described, with suitable etchants being provided for the various metals as required.

Whereas the present invention has been described with respect to specific embodiments thereof, it will be understood that various changes and modifications will be suggested to one skilled in the art, and it is intended to encompass these changes and modifications as fall within the true scope of the appended claims.

I claim:

1. In a semiconductor device having a multimetal lead of molybdenum, gold, and molybdenum, the combination comprising:
 a connection area generally defined on the gold level of said lead by an opening through a molybdenum level,
 a layer of corrosion-resistant material formed over the edges of the opening through the molybdenum level and extending for a distance over the gold level to seal the edges of the molybdenum level, and
 an insulation layer formed over said layer of corrosion-resistant material and defining an opening to said connection area.

2. The combination of claim 1 wherein said corrosion-resistant material comprises chromium.

3. The combination of claim 1 wherein said bonding area is of a size to receive a ball bond connection.

4. The combination of claim 1 and further comprising: a layer of metal covering edge portions of said corrosion-resistant material and abutting said insulation layer.

5. The combination of claim 4 wherein said layer of metal comprises gold.

6. A semiconductor device comprising:
 an insulated semiconductor substrate having a metal contact formed thereon, said metal contact comprising first, second and third adherent metal layers, said first metal layer being adherent to said insulated substrate and said third metal layer having an opening exposing a connection area on said second metal layer, a fourth metal layer over said third metal layer circumventing said connection area and partially covering the exposed area of said second metal layer, said fourth metal layer having corrosion-resistant properties superior to said second metal layer, and a layer of insulation material over said fourth metal layer.

7. The semiconductor device of claim 6 wherein said first metal layer and said third metal layer are molybdenum, said second metal layer is gold and said fourth metal layer is chromium.

8. The semiconductor device of claim 6 wherein a portion of said first metal layer electrically contacts a semiconductor region on said substrate.

* * * * *